United States Patent
Hamparian

(10) Patent No.: US 7,355,478 B2
(45) Date of Patent: Apr. 8, 2008

(54) RF AMPLIFIER WITH PULSE DETECTION AND BIAS CONTROL

(75) Inventor: Simon Hamparian, Emerson, NJ (US)

(73) Assignee: Andrew Corporation, West Chester, IL (US)

( * ) Notice: Subject to any disclaimer, the term of this patent is extended or adjusted under 35 U.S.C. 154(b) by 83 days.

(21) Appl. No.: 11/428,075

(22) Filed: Jun. 30, 2006

(65) Prior Publication Data

US 2008/0001669 A1    Jan. 3, 2008

(51) Int. Cl.
    H03G 3/10    (2006.01)
(52) U.S. Cl. ........................ 330/285; 330/296
(58) Field of Classification Search ............. 330/285, 330/296, 252, 69
    See application file for complete search history.

(56) References Cited

U.S. PATENT DOCUMENTS

| | | | |
|---|---|---|---|
| 3,740,656 A | | 6/1973 | Riley |
| 3,900,823 A | | 8/1975 | Sokal et al. |
| 4,266,245 A | * | 5/1981 | Balaban et al. ............. 348/545 |
| 4,334,317 A | | 6/1982 | Beesley |
| 4,352,030 A | | 9/1982 | Beesley |
| 5,343,324 A | | 8/1994 | Le et al. |
| 5,670,912 A | | 9/1997 | Zocher |
| 5,949,159 A | | 9/1999 | Takahashi |
| 6,081,558 A | | 6/2000 | North |
| 6,272,185 B1 | | 8/2001 | Brown |
| 6,458,121 B1 | | 10/2002 | Rosenstock et al. |
| 6,566,944 B1 | | 5/2003 | Pehlke et al. |
| 6,671,079 B2 | | 12/2003 | Fuller et al. |
| 6,724,840 B1 | * | 4/2004 | Osofsky et al. ............ 375/346 |
| 6,765,443 B2 | | 7/2004 | Pehike |
| 6,952,135 B2 | | 10/2005 | Cobley |
| 7,010,280 B1 | * | 3/2006 | Wilson ........................ 455/126 |
| 2003/0043025 A1 | | 3/2003 | Imnoue et al. |

FOREIGN PATENT DOCUMENTS

| | | |
|---|---|---|
| EP | 0401013 A2 | 12/1990 |
| EP | 0473166 A1 | 3/1992 |
| EP | 0694182 B1 | 2/1999 |
| GB | 2301248 A | 11/1996 |
| JP | 58016581 A | 1/1983 |
| JP | 59169189 A | 9/1984 |
| JP | 61082111 A | 4/1986 |
| JP | 62030433 A | 2/1987 |
| WO | WO2004088836 A1 | 10/2004 |
| WO | WO2005079313 A2 | 9/2005 |

* cited by examiner

Primary Examiner—Henry Choe
(74) Attorney, Agent, or Firm—Wood, Herron & Evans, LLP

(57) ABSTRACT

An RF amplifier includes at least one RF amplification stage having an RF input signal and an RF output signal and a power signal circuit with power supply coupled with the amplification stage for providing a power signal to the amplification stage.

A bias circuit biases the amplification stage to control its operation.

A pulse detection circuit is coupled with the power signal circuit and the bias circuit and detects a voltage from the power signal.

The pulse detection circuit analyzes the detected voltage of the power signal and determines if the RF input signal presents a pulsed signal condition or non-pulsed signal condition, and controls the bias circuit for biasing the amplification stage according to the determined condition.

31 Claims, 2 Drawing Sheets

RF AMPLIFIER WITH PULSE DETECTION AND BIAS CONTROL

FIELD OF THE INVENTION

The present invention relates generally to RF amplifiers, and particularly to RF amplifiers utilized for the transmission of voice and data signals.

BACKGROUND OF THE INVENTION

In wireless communication applications, various signal formats are utilized to transfer both voice signals as well as data signals. In a typical wireless communication system, such as a cellular system, a plurality of base stations utilizing transceivers with RF amplifiers are used to transceive signals with a plurality of mobile devices, such as cellular phones. Traditionally, such wireless communications were focused upon the transmission of voice signals as telephonic applications drove the earliest needs for such systems. However, data applications have become more prevalent such that it is desirable that a base station be able to adequately handle both voice signals and data signals in their various forms.

In more modern wireless communication protocols, such as CDMA (Code Division Multiple Access) systems, it is desirable to monitor and control the output power of the base station RF amplifiers, as well as the linearity of such amplifiers. CDMA applications are particularly sensitive to non-linearities and power levels. Therefore, in current RF amplifier design, the bias currents of the various amplifier stages in the RF line (which are typically A/B amplifier stages) are controlled to minimize interference between the various channels of the system. The amplifier performance is commonly referred to as Adjacent Channel Leakage performance (ACPR).

Generally, a low Adjacent Channel Leakage is desirable to yield the best ACPR performance of the system. As noted above, voice signals have traditionally dominated wireless communication applications, whereas, data signal transmission is currently increasing. Conventionally, the bias currents of a typical RF amplifier at a base station have been adjusted for the best ACPR performance when the amplifier is working with and amplifying voice signals, which are considered non-pulsed input signals. That is, the amplifier is optimized for non-pulsed voice signals or a non-pulsed condition. However, data signals are pulsed signals and present a pulsed signal condition to the amplifier.

Specifically, one such example is a CDMA High Data Rate (HDR) signal. The transmission of such pulsed data signals through amplifiers that are optimized for non-pulsed voice signals leads to degraded performance. More specifically, the amplifiers become more non-linear under pulsed signal conditions because of the amplifier's increased gain expansion when operated under such pulsed conditions. This leads to a non-optimum ACPR performance (6-8 dB higher emissions) under such pulsed signal conditions.

In some products, a pulsed input signal is detected by means of an input RMS detector, an envelope detector and high-speed A/D converter, and a Field Programmable Gate Array (FPGA) integrated circuit. The input RMS detector is used to determine the average value of the input signal. The envelope detector and A/D are used to determine the peak value of the input signal. The FPGA is programmed to calculate the peak-to-average ratio of the input signal, and, based on this information, it determines if the input signal is pulsed.

There is still a need to provide an improved and low cost amplifier that can detect the presence of a pulsed RF signal that is applied to the amplifier, such as when this type of signal information is not available from the base station, or when the above mentioned components are not incorporated in the amplifier due to cost constraints. There is further need to improve amplifier performance and linearity for handling a variety of different signals that are amplified and transmitted, such as at a base station. Also, there is a need to ensure proper performance of the amplifier for both voice and data signals.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF EMBODIMENTS OF THE INVENTION

The present invention provides an amplifier that is able to detect the presence of a pulsed RF signal that is applied to the amplifier, when that signal information is not available from another source, such as the base station. The present application is particularly useful for amplifying both voice and data signals and optimizing the performance of the amplifier for both a non-pulsed input signal (voice signal) and a pulsed input signal (data signal). The invention optimizes the ACPR performance under both pulsed and non-pulsed signal conditions.

Figure 1:
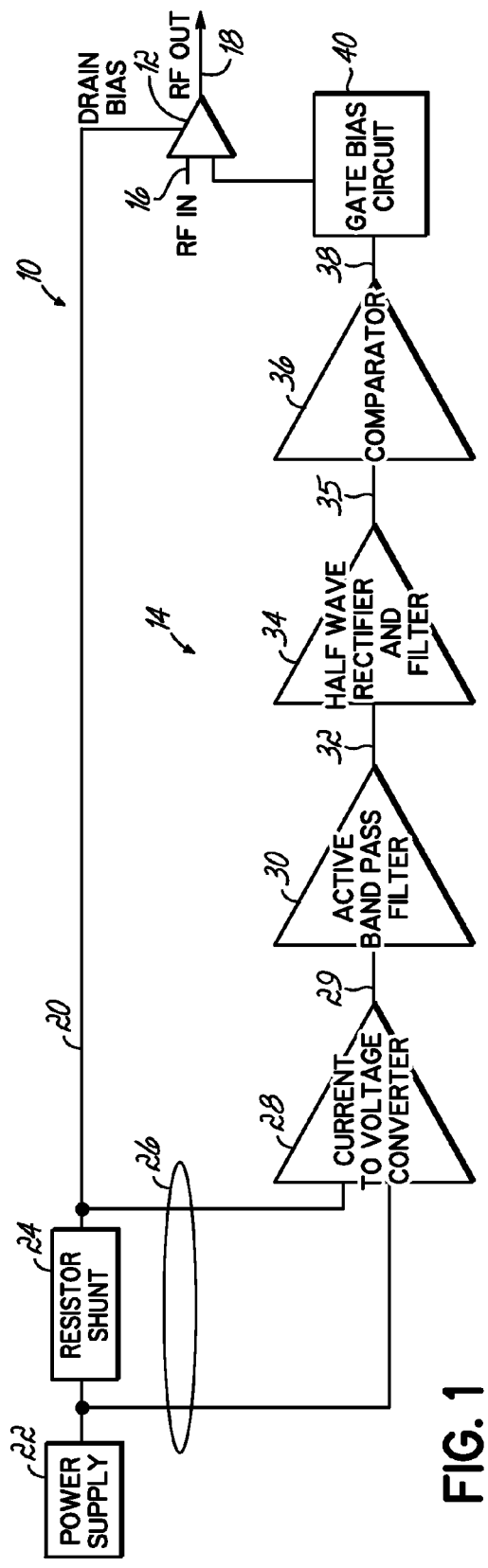
FIG. 1 is a block diagram of one embodiment of the present invention.
Figure 2:
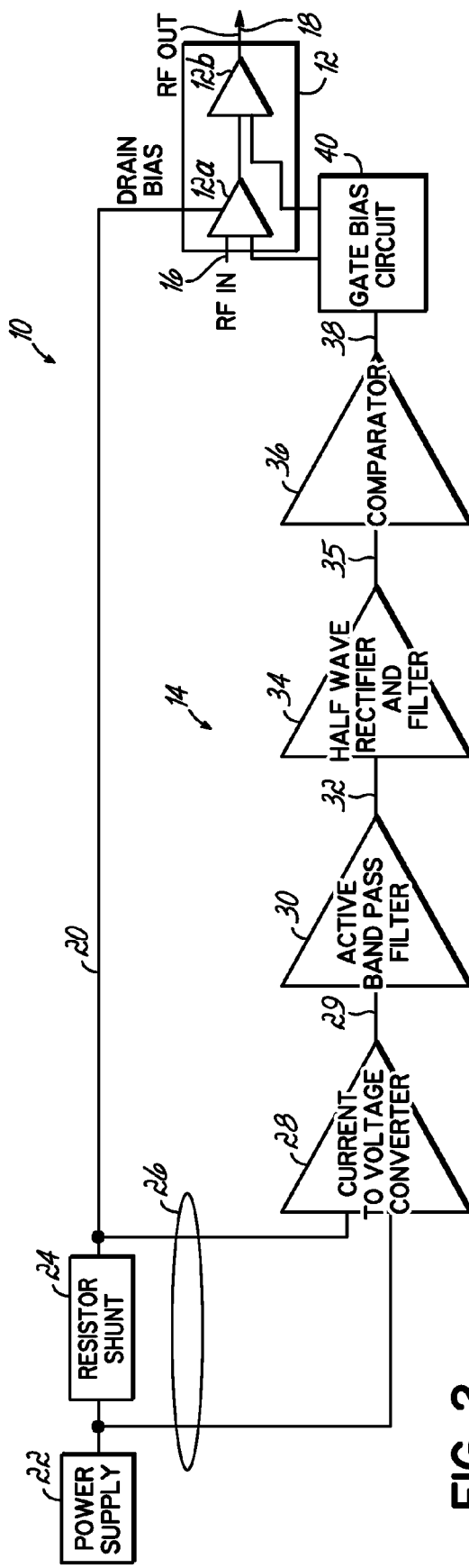
FIG. 2 is a block diagram of another embodiment of the present invention.

Referring to FIG. 1, a high level block diagram of one embodiment of the invention is shown in the form of an overall RF amplifier circuit 10 which incorporates an amplifier 12 and a pulse detector circuit 14 coupled with the amplifier for detecting a pulsed RF input signal. As discussed with respect to FIG. 1, amplifier 12 includes at least one amplification stage or may include multiple amplification stages as illustrated in FIG. 2. In one embodiment, amplifier 12 is a high power RF amplifier which receives an RF input signal 16 and generates an amplified RF output signal 18 for transmission. In a base station application, the output signal 18 may be coupled to an appropriate antenna structure (not shown) for wireless transmission of the amplified output signal. Typically, in RF power amplifiers, amplifier 12, including its one or more amplification stages, may be biased to operate as a Class A/B device. However, the present invention is not specifically limited to such a device operation and will be applicable to other amplifier classes as well, such as Class B amplifiers, class C and other classes as are known in the art.

Referring again to FIG. 1, RF amplifier circuit 10 includes an appropriate power supply circuit or power signal circuit which includes a power supply 22 capable of providing a power signal such as a supply current or drain bias 20. The invention uses the power signal or bias current 20 to determine if the RF input signal 16 is pulsed. Specifically, the current in the amplifier 12, such as a Class A/B stage, is proportional to the RF power of the amplifier stage. Therefore, if the RF input signal 16 to amplifier 12 is pulsed, the power signal or bias current 20 drawn by the amplifier will also be pulsed. The present invention thereby monitors the power signal or condition of the bias current 20 to determine the pulsed or non-pulsed signal condition of the RF input signal 16.

In one embodiment of the invention, the power signal is monitored to obtain or detect a voltage or voltage signal reflective of the power signal. Specifically, in the example embodiment of FIG. 1, the bias current 20 is converted to a voltage signal to provide a voltage that is proportional to the bias current. In the embodiment of FIG. 1, a resistive shunt element or resistor 24 is positioned or shunted between supply 22 and amplifier 12 to provide the voltage signal on lines 26. The voltage signal 26 is then fed to a suitable amplifier device which, with element 24, acts as a current-to-voltage converter that amplifies the voltage signal on line 26 and provides a voltage signal 29 that is proportional to the current level of the bias current 20. In that way, pulse detection circuit 14 detects a voltage signal 26 from the power signal 20 that is reflective of the power signal, such as the current level of the power signal 20. Reflective of the power current level 20, the output 29 of the converter element 28 is also pulsed when the RF input signal 16 is pulsed. This yields a pulsed output signal at reference point 29.

Signal 29 is input to an active bandpass filter 30 which analyses and processes the signal and provides an output 32 that generally only contains the fundamental frequency of the pulsed voltage signal that is applied at its input. The active bandpass filter 30 effectively attenuates all other frequency components that might be associated with input signal 29. As a result, if the voltage signal 29 applied at the input of the active bandpass filter 30 is not pulsed (indicating a non-pulsed RF input signal 16), there will effectively be no voltage signal at the output 32 of the active bandpass filter 30. Conversely, if the RF input signal 16 is pulsed, output 32 a voltage signal that contains the fundamental frequency of the pulsed voltage 29 reflective of the pulsed RF input signal 16. In that way, the pulse detection circuit analyzes the detected voltage of the power signal and determines if the RF input signal presents a pulsed signal condition or a non-pulsed signal condition.

In the presence of the pulsed signal condition, a halfwave rectifier and filter circuit or component 34 takes the fundamental voltage component of the pulsed waveform 32 and rectifies it and filters it to provide a DC voltage signal 35 at the output. As noted, if there is a non-pulsed signal condition, there is effectively no voltage signal at output 32 to rectify.

The signal at 35 is fed to a comparator circuit 36. The comparator circuit 36 uses the DC signal 35, which is proportional to the magnitude of the fundamental voltage of the pulsed detected voltage waveform, to provide a multiple state or multistate signal 38 for control of the gate bias of amplifier 12. In one embodiment of the invention, the signal 38 is a two-stage signal. One state indicates the presence of a pulsed signal condition. The other state indicates the absence of the pulsed signal condition or a non-pulsed signal condition.

A bias circuit 40, such as a gate bias circuit, is appropriately coupled to the amplifier 12 to vary the bias condition for amplifier 12 in accordance with the sensed state. The bias circuit 40 is operable to bias the amplification stage at different biasing points dependent upon the state of the multistate signal. For example, if the bias circuit 40 normally biases amplifier 12 to be optimized for non-pulsed type (voice) signals, circuit 40 will vary the bias point of the amplifier to optimize the ACPR whenever a pulsed signal condition (data) is detected in the RF input signal 16 and the comparator output 38 switches states. When the pulsed condition no longer exists, the comparator output 38 switches states and the bias circuit 40 changes the bias of amplifier 12 back to the normal biasing conditions that are optimized for non-pulsed signals. In one embodiment, the bias circuit 40 varies the gate voltage of the amplifier to change the bias point of the amplifier. As such, even though the bias circuit might still be operable to primarily bias the amplifier for a non-pulsed voice signal, it will be switched to operate for a pulsed data signal when necessary.

Figure 3:
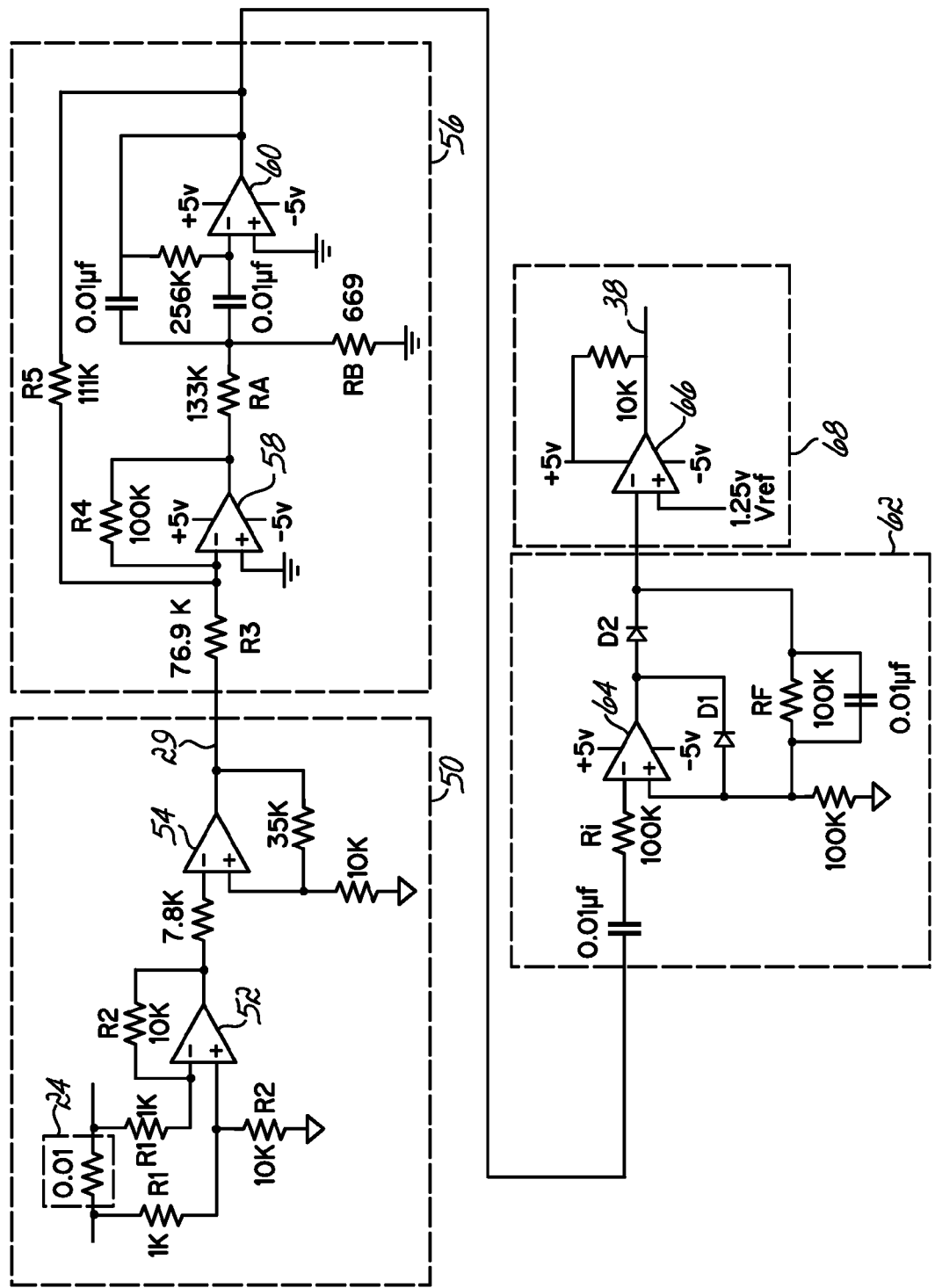
FIG. 3 is a circuit schematic of one embodiment of a circuit for implementing the invention.

FIG. 3 illustrates one embodiment of a circuit for implementing various elements of the invention as set forth in FIGS. 1 and 2. In the embodiment of FIG. 3, the various circuit elements are implemented utilizing operational amplifiers or op-amps in a variety of different configurations.

Referring to FIG. 3, element 50 indicates one embodiment of the current-to-voltage converter 28 implemented utilizing op-amps. Therein, a couple of op-amps 52, 54 are cascaded to provide the output signal 29 which indicates a pulsed signal condition or a non-pulsed signal condition as discussed above. The current-to-voltage converter is then coupled to an active bandpass filter circuit 56 which provides the desired functionality for the active bandpass filter element 30 illustrated in FIG. 1. Operational amplifier elements 58, 60 are coupled together with appropriate resistor elements and capacitor elements as shown to provide an active bandpass filter. In the embodiment illustrated, the center frequency $F_C$ is approximately 1.2 kHz, with a bandwidth of approximately +/−12 Hz. The circuit 56 illustrated has a bandpass filter gain of approximately 22 dB. As may be readily appreciated, the circuits as illustrated in FIG. 3 are merely exemplary, as are the arrangements of the individual circuit components and resistor and capacitor elements. Furthermore, the values of those various resistor and capacitor elements might also be varied to achieve similar results within a bandpass filter. Preferably, the Q-factor (Q) is greater than or equal to 100.

Next, circuit 62 utilizes another operational amplifier 64, arranged with respective resistor, capacitor and diode elements as shown to rectify the output signal 32 from the bandpass filter 30, as provided by rectifier 34, as illustrated in FIG. 1. Finally, an op-amp element 66 is operable to provide the functionality of the comparator element 36 utilizing the circuit 68 as shown in FIG. 3. A voltage reference ($V_{REF}$) may be utilized in the comparator circuit 68 to provide a high level or low level output 38, based upon the pulsed or non-pulsed signal condition as detected by the pulse detector of the invention.

As noted, FIG. 3 illustrates one example of a circuit that might be utilized to implement the present invention and the invention is not limited to the details of FIG. 3.

Accordingly, the present invention provides an amplifier and respective detection circuit which detects the condition of the RF input signal and varies the bias of the amplifier accordingly. The present invention provides a cost-effective way for optimizing the performance of an amplifier for both voice and data signals.

While the embodiment of FIG. 1, as noted above, shows amplifier 12 with a single stage, amplifier 12 might also be implemented in multiple stages. The present invention is suitable for also adjusting the bias operation point of multiple RF amplifier stages in accordance with the aspects of the invention to optimize the overall amplifier. For example, as illustrated in FIG. 2, amplifier 12 might be indicated by multiple stages, such as Stage 12a and Stage 12b, or even more additional stages. The bias circuit 40 may appropriately adjust the bias point of each amplifier stage in accordance with the invention.

While the present invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicant's general inventive concept.

What is claimed is:

1. An RF amplifier comprising:
    at least one RF amplification stage having an RF input signal and an RF output signal;
    a power signal circuit with a power supply coupled with the amplification stage for providing a power signal to the amplification stage
    a bias circuit for biasing the amplification stage to control its operation;
    a pulse detection circuit coupled with the power signal circuit and the bias circuit, the pulse detection circuit detecting a voltage from the power signal;
    the pulse detection circuit analyzing the detected voltage of the power signal and determining if the RF input signal presents a pulsed signal condition or non-pulsed signal condition and controlling the bias circuit for biasing the amplification stage according to the determined condition.

2. The amplifier of claim 1 further comprising a resistive element shunted between the power supply and the amplification stage for creating the voltage detected by the pulse detection circuit.

3. The amplifier of claim 1 wherein the pulse detection circuit includes a bandpass filter for analyzing the detected voltage, the bandpass filter outputting a signal reflective of the fundamental frequency of a pulsed detected voltage to indicate a pulsed signal condition.

4. The amplifier of claim 3 further including a current-to-voltage converter circuit for amplifying the detected voltage to provide an input to the bandpass filter.

5. The amplifier of claim 3 wherein the pulse detection circuit includes a rectifier circuit coupled to the output of the bandpass filter and operable for rectifying the signal reflective of the fundamental frequency to provide a DC signal.

6. The amplifier of claim 5 wherein the DC signal is reflective of the magnitude of the voltage of the pulsed detected voltage.

7. The amplifier of claim 1 wherein the pulse detection circuit further includes a comparator operable to output a multistate signal indicative of a pulsed signal condition or a non-pulsed signal condition.

8. The amplifier of claim 7 wherein the bias circuit is operable to bias the amplification stage at different biasing points dependent upon a state of the multistate signal.

9. The amplifier of claim 5 circuit further including a comparator coupled to the rectifier and operable to provide a multistate signal based upon the DC signal.

10. The amplifier of claim 1 wherein the bias circuit is operable to primarily bias the amplification stage for an RF input signal presenting a non-pulsed condition, the pulse detection circuit only varying the bias when a pulsed condition is presented.

11. The amplifier of claim 1 further comprising multiple amplification stages, the pulse detection circuit controlling the bias circuit for biasing each of the amplification stages according to the determined condition.

12. A pulse detection circuit for an RF amplifier having a power signal circuit and a bias circuit, the pulse detection circuit comprising:
    a circuit for providing a voltage signal from a power signal of the power signal circuit;
    a detection circuit operable for detecting and analyzing the voltage signal of the power signal and determining if the detected voltage signal reflects a pulsed signal condition or non-pulsed signal condition at an RF input signal to the amplifier;
    the detection circuit outputting a control signal for controlling the bias circuit to bias the amplification stage according to the determined condition.

13. The pulse detection circuit of claim 12 further comprising a resistive element shunted in the power signal circuit for creating the voltage signal analyzed by the pulse detection circuit.

14. The pulse detection circuit of claim 12 wherein the detection circuit includes a bandpass filter for analyzing the detected voltage signal, the bandpass filter outputting a signal reflective of the fundamental frequency of a pulsed detected voltage signal to indicate a pulsed signal condition.

15. The pulse detection circuit of claim 14 further including a current-to-voltage converter circuit for amplifying the detected voltage signal to provide an input to the bandpass filter.

16. The pulse detection circuit of claim 14 wherein the detection circuit includes a rectifier circuit coupled to the output of the bandpass filter and operable for rectifying the signal reflective of the fundamental frequency to provide a DC signal.

17. The pulse detection circuit of claim 16 wherein the DC signal is reflective of the magnitude of the voltage of the pulsed detected voltage signal.

18. The pulse detection circuit of claim 12 wherein the detection circuit further includes a comparator operable to output a multistate signal indicative of a pulsed signal condition or a non-pulsed signal condition.

19. The pulse detection circuit of claim 18 wherein the bias circuit is operable to bias the amplification stage at different biasing points dependent upon a state of the multistate signal.

20. The pulse detection circuit of claim 17 circuit further including a comparator coupled to the rectifier and operable to provide a multistate signal based upon the DC signal.

21. The pulse detection circuit of claim 12 wherein the bias circuit is operable to primarily bias the amplification stage for an RF input signal presenting a non-pulsed condition, the pulse detection circuit only varying the bias when a pulsed condition is presented.

22. The pulse detection circuit of claim 12 wherein the amplifier has multiple amplification stages, the detection circuit outputting multiple control signals for controlling the bias circuit for biasing each of the amplification stages according to the determined condition.

23. A method of controlling the bias of an RF amplifier comprising:
    monitoring a power signal to the amplifier to obtain a voltage signal reflective of the power signal;
    detecting the voltage signal;
    analyzing the detected voltage signal and determining if the voltage signal presents a pulsed signal condition or non-pulsed signal condition in the power signal; and
    controlling the biasing of the amplifier according to the determined condition.

24. The method of claim 23 further comprising shunting a resistive element between a power signal circuit and the amplifier for obtaining the voltage signal reflective of the power signal.

25. The method of claim 23 further comprising analyzing the detected voltage signal with a bandpass filter which outputs a signal reflective of the fundamental frequency of a pulsed detected voltage signal to determine a pulsed signal condition.

26. The method of claim 25 further including amplifying the detected voltage to provide an input to the bandpass filter.

27. The method of claim 25 further comprising rectifying the output of the bandpass filter reflective of the fundamental frequency and providing a DC signal.

28. The method of claim 27 wherein the DC signal is reflective of the magnitude of the voltage of the pulsed detected voltage signal.

29. The method of claim 27 further comprising inputting the DC signal to a comparator that is operable to provide a multistate signal based upon the DC signal.

30. The method of claim 29 further comprising biasing the amplification stage at different biasing points dependent upon a state of the multistate signal.

31. The method of claim 22 further comprising primarily biasing the amplification stage according to a non-pulsed condition and varying the biasing of the amplifier only when a pulsed condition is presented.

* * * * *